(12) United States Patent
Matsushita et al.

(10) Patent No.: US 6,888,189 B2
(45) Date of Patent: May 3, 2005

(54) DIELECTRIC ELEMENT INCLUDING OXIDE-BASED DIELECTRIC FILM AND METHOD OF FABRICATING THE SAME

(75) Inventors: Shigeharu Matsushita, Katano (JP); Kazunari Honma, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/956,817

(22) Filed: Sep. 21, 2001

(65) Prior Publication Data

US 2002/0055191 A1 May 9, 2002

(30) Foreign Application Priority Data

Nov. 8, 2000 (JP) ........................................ 2000-340045

(51) Int. Cl.⁷ ............................................. H10L 27/108
(52) U.S. Cl. ....................... 257/310; 257/306; 438/396; 438/399
(58) Field of Search ................................. 257/306, 310; 438/396, 399, 240, 253, 256

(56) References Cited

U.S. PATENT DOCUMENTS

| | | | |
|---|---|---|---|
| 5,111,355 A | 5/1992 | Anand et al. | |
| 5,122,923 A | 6/1992 | Matsubara et al. | |
| 5,504,041 A | 4/1996 | Summerfelt | 437/235 |
| 5,822,175 A | 10/1998 | Azuma | 361/321.5 |
| 5,843,830 A * | 12/1998 | Graettinger et al. | 438/396 |
| 5,998,258 A | 12/1999 | Melnick et al. | |
| 6,004,839 A | 12/1999 | Hayashi et al. | |
| 6,090,657 A | 7/2000 | Yamoto et al. | 438/240 |
| 6,177,351 B1 * | 1/2001 | Beratan et al. | 438/694 |
| 6,178,082 B1 * | 1/2001 | Farooq et al. | 361/303 |
| 6,180,971 B1 | 1/2001 | Maejima | 257/295 |
| 6,194,752 B1 * | 2/2001 | Ogasahara et al. | 257/295 |
| 6,225,656 B1 | 5/2001 | Cuchiaro et al. | |
| 6,235,603 B1 * | 5/2001 | Melnick et al. | 438/393 |
| 6,303,958 B1 | 10/2001 | Kanaya et al. | |
| 6,320,213 B1 * | 11/2001 | Kirlin et al. | 257/295 |
| 6,329,680 B1 | 12/2001 | Yoshida et al. | |

(Continued)

FOREIGN PATENT DOCUMENTS

| | | | |
|---|---|---|---|
| EP | 886317 A2 * | 12/1998 | ......... H01L/27/115 |
| EP | 0 886 317 A2 | 12/1999 | |
| JP | 02-183569 | 7/1990 | |
| JP | 8-191173 | 7/1996 | |

(Continued)

OTHER PUBLICATIONS

Shigeharu Matsushita, et al., "IrSiN Films with Superior Oxygen–Diffusion Barrier Effect for Stacked Ferroelectric Capacitors," Applied Physics Letter, vol. 77, No. 20, Nov. 13, 2000.

(Continued)

*Primary Examiner*—Amir Zarabian
*Assistant Examiner*—Christy Novacek
(74) *Attorney, Agent, or Firm*—Arent Fox, PLLC

(57) ABSTRACT

A dielectric element capable of effectively suppressing diffusion of oxygen into a region located under a lower electrode in heat treatment for sintering an oxide-based dielectric film is obtained. This dielectric element comprises a lower electrode including a first conductor film having a function of suppressing diffusion of oxygen, a first dielectric film, formed on the lower electrode, including an oxide-based dielectric film, and a first insulator film, arranged on a region other than the lower electrode, having a function of suppressing diffusion of oxygen. Thus, the first conductor film and the first insulator film function as barrier films preventing diffusion of oxygen, whereby the first conductor film effectively prevents oxygen from diffusing downward along grain boundaries of the lower electrode while the first insulator film effectively prevents oxygen from diffusing downward from the region other than the lower electrode in heat treatment for sintering the oxide-based dielectric film.

11 Claims, 7 Drawing Sheets

U.S. PATENT DOCUMENTS

| | | | |
|---|---|---|---|
| 6,358,794 B1 * | 3/2002 | Oh | 438/253 |
| 6,437,391 B1 | 8/2002 | Oh | 257/306 |
| 6,511,877 B2 | 1/2003 | Kanaya et al. | |
| 6,534,375 B2 * | 3/2003 | Iijima et al. | 438/386 |
| 2001/0021544 A1 | 9/2001 | Ohnuma et al. | 438/163 |
| 2001/0046789 A1 | 11/2001 | Taguwa | 438/780 |
| 2002/0021544 A1 | 2/2002 | Cho et al. | 361/200 |
| 2002/0047172 A1 | 4/2002 | Reid | 257/415 |

FOREIGN PATENT DOCUMENTS

| | | |
|---|---|---|
| JP | 8-335681 | 12/1996 |
| JP | 08-340091 | 12/1996 |
| JP | 09-252094 | 9/1997 |
| JP | 09-289291 | 11/1997 |
| JP | 10-56144 | 2/1998 |
| JP | 10-56145 | 2/1998 |
| JP | 10-050956 | 2/1998 |
| JP | 10-093043 | 4/1998 |
| JP | 11-040768 | 2/1999 |
| JP | 11-74488 | 3/1999 |
| JP | 11-068057 | 3/1999 |
| JP | 11-307736 | 11/1999 |
| JP | 2000-004001 | 1/2000 |
| JP | 2000-40800 | 2/2000 |
| JP | 2000-124154 | 4/2000 |
| JP | 2000-150825 | 5/2000 |
| JP | 2000-269455 | 9/2000 |
| JP | 2000-340769 | 12/2000 |
| JP | 2001-257327 | 9/2001 |
| JP | 2001-274160 | 10/2001 |
| JP | 2002-134715 | 5/2002 |
| WO | WO 97/50116 | 12/1997 |
| WO | WO 99/27579 | 6/1999 |

OTHER PUBLICATIONS

Effect of Mechanical Stress on Polarization of Ferroelectric Thin Films Extended Abstracts of the 1999 International Conference on Solid State Devices and Material, Tokyo, 1999, pp. 388–389, Kumagai et al.

Japanese Office Action for Application No. JP 2000–340045 and English Translation dated Nov. 11, 2004.

* cited by examiner

DIELECTRIC ELEMENT INCLUDING OXIDE-BASED DIELECTRIC FILM AND METHOD OF FABRICATING THE SAME

BACKGROUND OF THE INVENTION

1. Field of the Invention

The present invention relates to a dielectric element and a method of fabricating the same, and more specifically, it relates to a dielectric element such as a capacitor element employing an oxide-based dielectric film and a method of fabricating the same.

2. Description of the Prior Art

A ferroelectric memory is recently energetically studied as a nonvolatile memory having a high speed and lower power consumption. FIG. 13 is a sectional view showing a typical structure of a conventional ferroelectric memory, and FIG. 14 is a sectional view showing a capacitor part in FIG. 13 as viewed from a direction rotated by 90°.

In the conventional ferroelectric memory shown in FIGS. 13 and 14, a field insulator film 101, a well region 103 of a MOS transistor, a drain region 104, a bit line 105 connected to the drain region 104, a word line 106, source regions 107 and an interlayer dielectric film 114 are formed on an Si substrate 100. Oxide-based dielectric capacitors 112 are connected to the source regions 107 through plugs 108. The oxide-based dielectric capacitors 112 are formed by lower electrodes 109, an oxide-based dielectric film 110 and an upper electrode 111.

The lower electrodes 109 are connected to the plugs 108 made of tungsten (W). The oxide-based dielectric film 110 consisting of a ferroelectric substance such as $PbZr_xTi_{1-x}O_3$ (PZT) or $SrBi_2Ta_2O_9$ (SBT) is formed on the lower electrodes 109. The upper electrode 111 is formed on the oxide-based dielectric film 110. In particular, iridium (Ir), platinum (Pt) and a material containing these components is widely employed as the material for the lower electrodes 109. Such a material has low reactivity with the oxide-based dielectric film 110 or excellent high-temperature resistance. A material such as iridium (Ir) or platinum (Pt) is employed also for the upper electrode 111, similarly to the lower electrodes 109.

An interlayer dielectric film 115 is formed to cover the oxide-based dielectric capacitors 112. A plate line 113 is connected to the upper electrode 111 of the oxide-based dielectric capacitors 112 through a contact hole provided in the interlayer dielectric film 115.

A capacitor structure employing an oxide-based dielectric film of $Ba_xSr_{1-x}TiO_3$ (BST) or the like having a high dielectric constant is required also for a dynamic random access memory (DRAM) whose capacitor size is recently reduced following refinement of cells. The capacitor structure for the DRAM is similar to that shown in FIG. 13.

However, self-orientation of Ir or Pt employed as the material for the lower electrodes 109 is so strong that crystal grains thereof exhibit columnar structures when annealed. In this case, grain boundaries are oriented along a direction perpendicular to the substrate. When annealing is performed in a high-temperature oxygen atmosphere for sintering the oxide-based dielectric film 110 which is a capacitor insulator film, therefore, oxygen diffuses along the grain boundaries. Further, the oxygen diffuses not only along the regions of the lower electrodes 109 but also through isolation films (the interlayer dielectric films 115 and 114) around the lower electrodes 109. When oxygen diffuses under the lower electrodes 109, the plugs 108 of tungsten (W) located under the lower electrodes 109 are oxidized to form tungsten oxide films on these portions. Volume expansion caused by formation of the tungsten oxide films disadvantageously results in film separation or breakage of the capacitor element.

In general, the oxide-based dielectric film 110 is partially embedded between the adjacent lower electrodes 109, as shown in FIG. 14. When the intervals between the adjacent lower electrodes 109 are reduced following refinement of the element, therefore, parasitic capacitances on the side wall regions of the lower electrodes 109 are disadvantageously increased.

SUMMARY OF THE INVENTION

An object of the present invention is to provide a dielectric element capable of preventing oxidation of an electrode such as a plug located under a lower electrode by inhibiting oxygen from diffusing under the lower electrode.

Another object of the present invention is to reduce the parasitic capacitance between adjacent lower electrodes in the aforementioned dielectric element.

Still another object of the present invention is to provide a method of fabricating a dielectric element capable of readily fabricating a dielectric element capable of suppressing oxidation of a conductive material such as a plug located under a lower electrode.

A dielectric element according to a first aspect of the present invention comprises a lower electrode including a first conductor film having a function of suppressing diffusion of oxygen, a first dielectric film, formed on the lower electrode, including an oxide-based dielectric film, and a first insulator film, arranged on a region other than the lower electrode, having a function of suppressing diffusion of oxygen. The dielectric element according to the present invention is a wide concept including not only a capacitor element but also another element employing a dielectric substance.

In the dielectric element according to the present invention having the aforementioned structure, the first conductor film and the first insulator film function as barrier films preventing diffusion of oxygen. In heat treatment for sintering the oxide-based dielectric film, therefore, the first conductor film can effectively prevent oxygen from diffusing downward along grain boundaries of the lower electrode while the first insulator film can effectively prevent oxygen from diffusing downward from the region other than the lower electrode. Thus, oxygen can be effectively inhibited from diffusing into a region located under the lower electrode, whereby a conductive material such as a plug located under the lower electrode can be inhibited from oxidation. Therefore, in the case of a capacitor element connected to a plug consisting of tungsten, for example, formation of a tungsten oxide film can be suppressed so that film separation can be suppressed and the capacitor element can be prevented from breakage. Consequently, an element having excellent characteristics can be formed.

In the dielectric element according to the aforementioned first aspect, the first insulator film is preferably arranged to be in contact with the first conductor film. According to this structure, the first conductor film and the first insulator film having the functions of suppressing diffusion of oxygen are so continuously formed that the overall lower surface of the lower electrode is covered with the first conductor film and the first insulator film having the functions of suppressing diffusion of oxygen. Thus, oxygen can be inhibited from diffusing into the region located under the lower electrode, whereby the conductive material such as a plug located under the lower electrode can be more effectively inhibited from oxidation.

In the dielectric element according to the aforementioned first aspect, the first conductor film preferably contains a metal, silicon and nitrogen, and the metal preferably includes at least one element selected from a group consisting of Ir, Pt, Ru, Re, Ni, Ta, Co and Mo. According to the aforementioned structure, the first conductor film can have the function of suppressing diffusion of oxygen.

In the dielectric element according to the aforementioned first aspect, the first insulator film preferably has a smaller dielectric constant than the oxide-based dielectric film. When the first insulator film is arranged between adjacent lower electrodes in this case, the parasitic capacitance between the adjacent lower electrodes can be reduced as compared with the case of arranging the oxide-based dielectric film between the adjacent lower electrodes.

In the dielectric element according to the aforementioned first aspect, the first insulator film preferably includes at least one film selected from a group consisting of an SiN film, an SiON film, an $Al_2O_3$ film and a $TiO_2$ film. When formed by such a film, the first insulator film can have the function of suppressing diffusion of oxygen and a dielectric constant smaller than that of the oxide-based dielectric film. Consequently, the aforementioned two effects of preventing diffusion of oxygen and reducing the parasitic capacitance can be simultaneously attained.

In the dielectric element according to the aforementioned first aspect, the first insulator film is preferably formed to cover the side walls of the lower electrode including the first conductor film. Thus, diffusion of oxygen can be prevented also on the interface between the side walls of the lower electrode and the first insulator film, whereby the ability for preventing diffusion of oxygen can be more improved.

The dielectric element according to the aforementioned first aspect preferably further comprises a second insulator film, formed on the first insulator film, having smaller residual stress than the first insulator film. According to this structure, residual stress of the overall insulator film consisting of the first and second insulator films can be reduced. Thus, the insulator film can be prevented from cracking resulting from stress, whereby a fabrication process can be stabilized and the reliability of the element can be improved. In this case, the second insulator film preferably includes at least one film selected from a group consisting of an $SiO_2$ film, an SiOF film and an SiOC film. Thus, the second insulator film having smaller residual stress than the first insulator film can be readily formed.

In the dielectric element according to the aforementioned first aspect, the lower electrode including the first conductor film is preferably formed on a conductive material. Thus, the first conductor film and the first insulator film can suppress oxidation of the conductive material located under the lower electrode. In this case, the conductive material preferably includes either a tungsten plug or a polysilicon plug. When a tungsten plug or a polysilicon plug is employed as the conductive material, oxidation of the tungsten plug or the polysilicon plug is suppressed. Thus, a generally employed technique of forming a tungsten plug or a polysilicon plug can be applied as such with no problem. Consequently, a stacked capacitor structure, for example, can be formed while suppressing oxidation.

In the dielectric element according to the aforementioned first aspect, the lower electrode preferably includes a second conductor film formed on the first conductor film. According to this structure, a film having a function of suppressing diffusion of oxygen can be employed as the first conductor film while a film having low reactivity with the oxide-based dielectric film ca be employed as the second conductor film. Thus, an oxide-based dielectric film having excellent characteristics can be formed while suppressing diffusion of oxygen.

The dielectric element according to the aforementioned first aspect preferably further comprises an upper electrode formed on the first dielectric film, and the lower electrode, the first dielectric film including the oxide-based dielectric film and the upper electrode preferably form a dielectric capacitor. Thus, a dielectric capacitor having excellent characteristics capable of effectively inhibiting oxygen from diffusing into the region located under the lower electrode can be readily formed. In this case, the oxide-based dielectric film may include a ferroelectric film, and the dielectric capacitor may include a ferroelectric capacitor.

A method of fabricating a dielectric element according to a second aspect of the present invention comprises steps of forming a lower electrode including a first conductor film having a function of suppressing diffusion of oxygen, forming an insulator film having a function of suppressing diffusion of oxygen on the lower electrode and a region other than the lower electrode, removing a part of the insulator film formed on the lower electrode by polishing, forming an oxide-based dielectric film on the lower electrode and forming an upper electrode on the oxide-based dielectric film.

In the method of fabricating a dielectric element according to the second aspect, the insulator film having the function of suppressing diffusion of oxygen is formed on the lower electrode including the first conductor film having the function of suppressing diffusion of oxygen and the region other than the lower electrode and thereafter the part of the insulator film formed on the lower electrode is removed by polishing, so that the insulator film having the function of suppressing diffusion of oxygen can be readily formed on the region other than the lower electrode. Thus, the first conductor film and the insulator film having the functions of suppressing diffusion of oxygen can effectively inhibit oxygen from diffusing into a region located under the lower electrode. Consequently, a dielectric element capable of suppressing oxidation of a conductive material located under the lower electrode can be readily fabricated.

In the method of fabricating a dielectric element according to the aforementioned second aspect, the step of removing the part of the insulator film formed on the lower electrode preferably includes a step of removing the part of the insulator film formed on the lower electrode by CMP. When CMP is employed, the part of the insulator film formed on the lower electrode can be readily removed, so that the insulator film can be readily embedded between lower electrodes.

In the method of fabricating a dielectric element according to the aforementioned second aspect, the step of removing the part of the insulator film formed on the lower electrode preferably includes a step of removing the part of the insulator film formed on the lower electrode by polishing thereby forming the insulator film on the region other than the lower electrode to be in contact with the first conductor film of the lower electrode. According to this structure, the first conductor film and the insulator film having the functions of suppressing diffusion of oxygen are continuously formed so that the overall lower surface of the lower electrode is covered with the first conductor film and the insulator film having the functions of suppressing diffusion of oxygen. Thus, oxygen can be inhibited from diffusing into the region located under the lower electrode, so that a conductive material such as a plug located under the lower electrode can be more effectively inhibited from oxidation.

In the method of fabricating a dielectric element according to the aforementioned second aspect, the first conductor film preferably contains a metal, silicon and nitrogen, and the metal preferably includes at least one element selected from a group consisting of Ir, Pt, Ru, Re, Ni, Ta, Co and Mo. According to this structure, the first conductor film can have the function of suppressing diffusion of oxygen.

In the method of fabricating a dielectric element according to the aforementioned second aspect, the insulator film preferably includes a first insulator film having a function of suppressing diffusion of oxygen and a second insulator film, formed on the first insulator film, having smaller residual stress than the first insulator film. According to this structure, residual stress of the overall insulator film consisting of the first and second insulator films can be reduced. Thus, the insulator film can be prevented from cracking resulting from stress, whereby the fabrication process can be stabilized and the reliability of the element can be improved.

In the aforementioned method of fabricating a dielectric element, the first insulator film preferably has a smaller dielectric constant than the oxide-based dielectric film. When the first insulator film is arranged between adjacent lower electrodes in this case, the parasitic capacitance between the adjacent lower electrodes can be reduced as compared with the case of arranging the oxide-based dielectric film between the adjacent lower electrodes.

In the aforementioned method of fabricating a dielectric element, the first insulator film preferably includes at least one film selected from a group consisting of an SiN film, an SiON film, an $Al_2O_3$ film and a $TiO_2$ film. When formed by such a film, the first insulator film can have the function of suppressing diffusion of oxygen and a dielectric constant smaller than that of the oxide-based dielectric film. Consequently, the aforementioned two effects of preventing diffusion of oxygen and reducing the parasitic capacitance can be simultaneously attained.

In the aforementioned method of fabricating a dielectric element, the second insulator film preferably includes at least one film selected from a group consisting of an $SiO_2$ film, an SiOF film and an SiOC film. Thus, the second insulator film having smaller residual stress than the first insulator film can be readily formed.

In the method of fabricating a dielectric element according to the aforementioned second aspect, the step of forming the lower electrode preferably includes a step of forming a second conductor film on the first conductor film having the function of suppressing diffusion of oxygen. According to this structure, a film having a function of suppressing diffusion of oxygen can be employed as the first conductor film while a film having low reactivity with the oxide-based dielectric film can be employed as the second conductor film. Thus, an oxide-based dielectric film having excellent characteristics can be formed while suppressing diffusion of oxygen.

A method of fabricating a dielectric element according to a third aspect of the present invention comprises steps of forming an insulator film having a function of suppressing diffusion of oxygen, forming an opening in the insulator film, forming a lower electrode including a first conductor film having a function of suppressing diffusion of oxygen in the opening and on the insulator film, removing a part of the lower electrode including the first conductor film formed on the insulator film by polishing, forming an oxide-based dielectric film on the lower electrode formed in the opening and forming an upper electrode on the oxide-based dielectric film.

In the method of fabricating a dielectric element according to the third aspect, the lower electrode including the first conductor film having the function of suppressing diffusion of oxygen is formed in the opening of the insulator film having the function of suppressing diffusion of oxygen and on the insulator film and thereafter the part of the lower electrode including the first conductor film formed on the insulator film is removed by polishing, whereby the lower electrode including the first conductor film having the function of suppressing diffusion of oxygen can be readily formed in the opening of the insulator film having the function of suppressing diffusion of oxygen. Thus, the first conductor film and the insulator film having the functions of suppressing diffusion of oxygen can effectively inhibit oxygen from diffusing into a region located under the lower electrode. Consequently, a dielectric element capable of suppressing oxidation of a conductive material located under the lower electrode can be readily fabricated.

In the method of fabricating a dielectric element according to the aforementioned third aspect, the step of removing the part of the lower electrode including the first conductor film formed on the insulator film preferably includes a step of removing the part of the lower electrode including the first conductor film formed on the insulator film by CMP. When CMP is employed, the part of the lower electrode located on the insulator film can be readily removed, whereby the lower electrode can be readily embedded in the opening of the insulator film.

In the method of fabricating a dielectric element according to the aforementioned third aspect, the step of removing the part of the lower electrode including the first conductor film formed on the insulator film preferably includes a step of removing the part of the lower electrode including the first conductor film formed on the insulator film by polishing thereby forming the first conductor film of the lower electrode in the opening to be in contact with the insulator film. According to this structure, the first conductor film and the insulator film having the functions of suppressing diffusion of oxygen are continuously formed, whereby the overall lower surface of the lower electrode is covered with the first conductor film and the insulator film having the functions of suppressing diffusion of oxygen. Thus, oxygen can be inhibited from diffusing into a region located under the lower electrode, whereby a conductive material such as a plug located under the lower electrode can be more effectively inhibited from oxidation.

In the method of fabricating a dielectric element according to the aforementioned third aspect, the first conductor film preferably contains a metal, silicon and nitrogen, and the metal preferably includes at least one element selected from a group consisting of Ir, Pt, Ru, Re, Ni, Ta, Co and Mo. According to this structure, the first conductor film can have the function of suppressing diffusion of oxygen.

In the method of fabricating a dielectric element according to the third aspect, the insulator film preferably includes a first insulator film having a function of suppressing diffusion of oxygen and a second insulator film, formed on the first insulator film, having smaller residual stress than the first insulator film. According to this structure, residual stress of the overall insulator film consisting of the first and second insulator films can be reduced. Thus, the insulator film can be prevented from cracking resulting from stress.

Consequently, the fabrication process can be stabilized and the reliability of the element can be improved.

In the aforementioned method of fabricating a dielectric element, the first insulator film preferably has a smaller dielectric constant than the oxide-based dielectric film. When the first insulator film is arranged between adjacent lower electrodes in this case, the parasitic capacitance between the adjacent lower electrodes can be reduced as compared with the case of arranging the oxide-based dielectric film between the adjacent lower electrodes.

In the aforementioned method of fabricating a dielectric element, the first insulator film preferably includes at least one film selected from a group consisting of an SiN film, an SiON film, an $Al_2O_3$ film and a $TiO_2$ film. When formed by such a film, the first insulator film can have the function of suppressing diffusion of oxygen and a smaller dielectric constant than the oxide-based dielectric film. Consequently, the aforementioned two effects of preventing diffusion of oxygen and reducing the parasitic capacitance can be simultaneously attained.

In the aforementioned method of fabricating a dielectric element, the second insulator film preferably includes at least one film selected from a group consisting of an $SiO_2$ film, an SiOF film and an SiOC film. Thus, the second insulator film having smaller residual stress than the first insulator film can be readily formed.

In the method of fabricating a dielectric element according to the aforementioned third aspect, the step of forming the lower electrode preferably includes a step of forming a second conductor film on the first conductor film having the function of suppressing diffusion of oxygen. According to this structure, a film having a function of suppressing diffusion of oxygen can be employed as the first conductor film while a film having low reactivity with the oxide-based dielectric film can be employed as the second conductor film. Thus, an oxide-based dielectric film having excellent characteristics can be formed while suppressing diffusion of oxygen.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
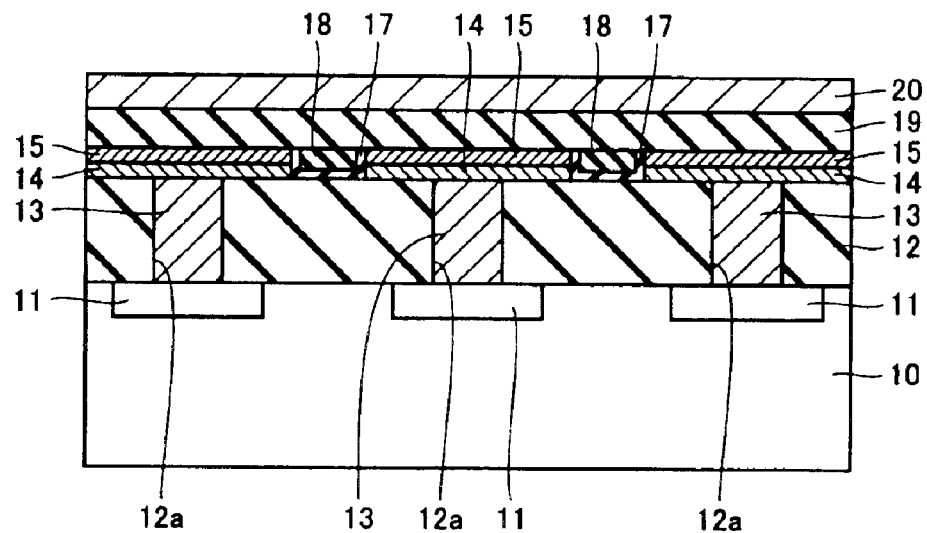
FIG. 1 is a sectional view showing the structure of a capacitor element according to a first embodiment of the present invention.

Embodiments of the present invention are now described with reference to the drawings.

(First Embodiment)

The structure of a capacitor element according to a first embodiment of the present invention is now described with reference to FIG. 1. In the capacitor element according to the first embodiment, n-type doped layers 11 are formed on the surface of an Si substrate 10 at prescribed intervals. An insulator film 12 is formed on the Si substrate 10, and contact holes 12a are formed in this insulator film 12. Tungsten plugs 13 are embedded in the contact holes 12a. IrSiN films 14 serving as oxygen diffusion barrier films are formed in a thickness of about 100 nm, to be connected with the tungsten plug 13. Pt films 15 forming lower electrodes are formed on the IrSiN films 14 in a thickness of about 150 nm. The tungsten plugs 13 are examples of the "conductive material" according to the present invention, and the IrSiN films 14 are examples of the "first conductor film" according to the present invention. The Pt films 15 are examples of the "second conductor film" according to the present invention.

Multilayer films of SiN films 17 and $SiO_2$ films 18 are embedded between the lower electrodes consisting of the IrSiN films 14 and the Pt films 15. The SiN films 17 are formed in a thickness of about 50 nm, to be in contact with the side walls of the IrSiN films 14 and the Pt films 15. The $SiO_2$ films 18 generally have smaller residual stress than the SiN films 17. The SiN films 17 define oxygen diffusion barrier films having a function of preventing diffusion of oxygen. The SiN films 17 are examples of the "first insulator film" according to the present invention, and the $SiO_2$ films 18 are examples of the "second insulator film" according to the present invention. According to the first embodiment, the IrSiN films 14 defining the oxygen diffusion barrier films arranged on the lower electrodes and the SiN films 17 defining the oxygen diffusion barrier films arranged on regions other than the lower electrodes are in contact with each other. Thus, the overall lower surfaces of the lower electrodes are covered with the oxygen diffusion barrier films.

An SBT film 19 which is a ferroelectric film is formed on the Pt films 15 and the $SiO_2$ films 18 in a thickness of about 200 nm. The SBT film 19 is an example of the "first dielectric film including an oxide-based dielectric film" according to the present invention. A Pt film 20 defining upper electrodes is formed on the SBT film 19.

A fabrication process for the capacitor element according to the first embodiment is now described with reference to FIGS. 2 to 5.

Figure 2:
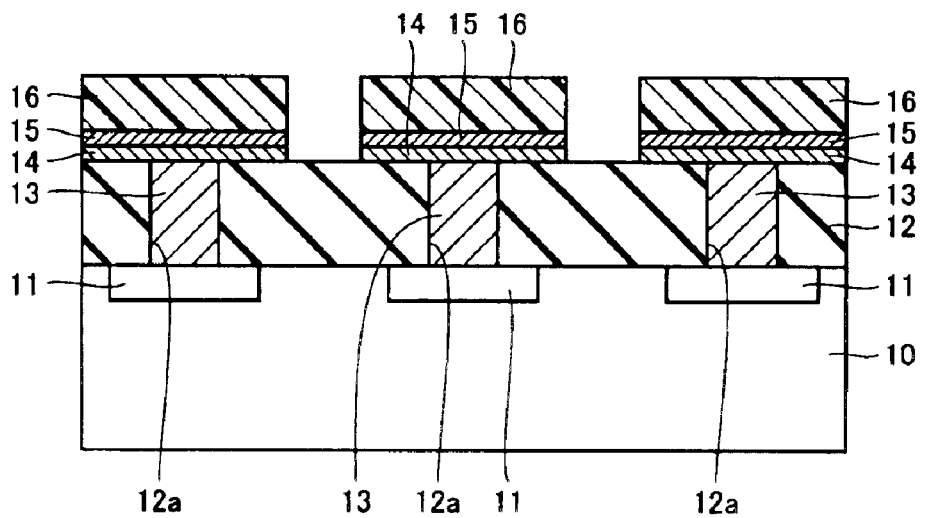
FIGS. 2 to 5 are sectional views for illustrating a fabrication process for the capacitor element according to the first embodiment shown in FIG. 1.

First, the n-type doped layers 11 are formed on the surface of the Si substrate 10, as shown in FIG. 2. The insulator film 12 is formed on the n-type doped layers 11. The contact holes 12a are formed in regions of the insulator film 12 located on the n-type doped layers 11. The tungsten plugs 13 are formed to fill up the contact holes 12a. The IrSiN films 14 defining the oxygen diffusion barrier films are formed on the tungsten plugs 13 in a thickness of about 100 nm. The Pt films 15 are formed on the IrSiN films 14 in a thickness of about 150 nm. Thereafter photoresist films 16 are formed on prescribed regions of the Pt films 15. The photoresist films 16 are employed as masks for etching the Pt films 15 and the IrSiN films 14, thereby forming the lower electrodes consisting of the patterned IrSiN films 14 and Pt films 15 as shown in FIG. 2. Thereafter the photoresist films 16 are removed.

Figure 3:
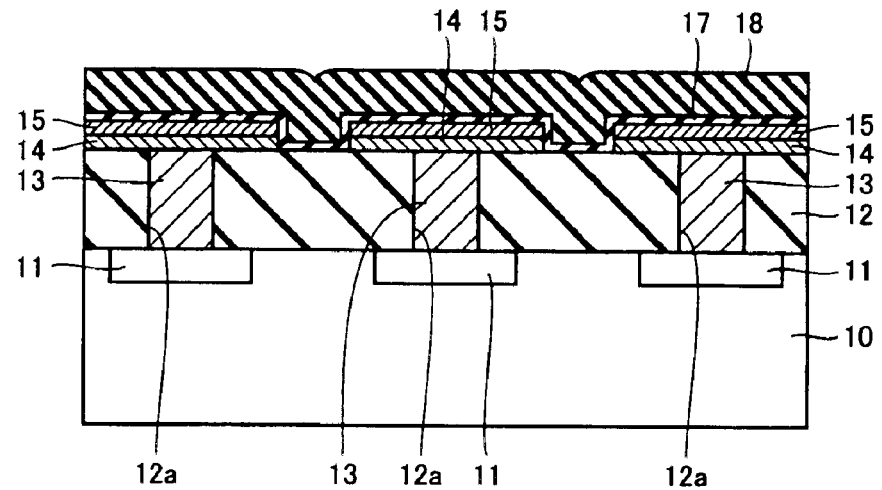
Figure 4:
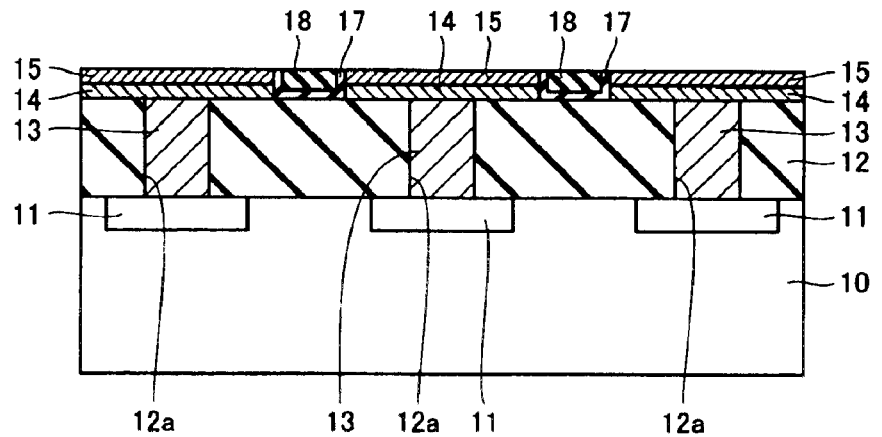

Then, the SiN films 17 functioning as the oxygen diffusion barrier films are deposited in a thickness of about 50 nm, as shown in FIG. 3. The $SiO_2$ films 18 are deposited on the SiN films 17 in a thickness of about 300 nm. Thereafter the SiO$_2$ films 18 and the SiN films 17 located on the Pt films 15 are removed by CMP (chemical mechanical polishing). Thus, the shape shown in FIG. 4 is obtained.

The IrSiN films 14 defining the oxygen diffusion barrier films arranged on the lower electrodes and the SiN films 17 defining the oxygen diffusion barrier films arranged on regions other than the lower electrodes come into contact with each other through the aforementioned step. The IrSiN films 14 and the SiN films 17 prevent oxygen from diffusing into regions under the lower electrodes when annealing is performed for sintering the SBT film 19 as described later.

Figure 5:
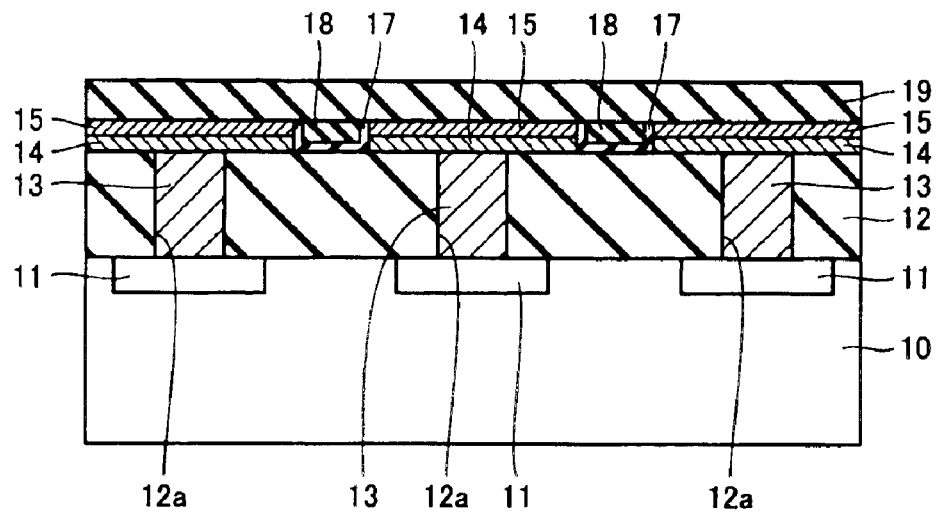

Then, the SBT film 19 which is a ferroelectric film is formed to cover the overall surface in a thickness of about 200 nm by a sol-gel method, as shown in FIG. 5. In this case, pre-annealing is performed under conditions of 200° C. and five minutes. Application is performed twice.

Finally, the Pt film 20 defining the upper electrodes is formed on the SBT film 19, as shown in FIG. 1. Thereafter the Pt film 20 and the SBT film 19 are patterned through a photoresist film (not shown). Then, the photoresist film is removed. Thereafter annealing is performed in an oxygen atmosphere at 800° C. for 40 minutes, in order to sinter the SBT film 19.

Thus, a ferroelectric capacitor according to the first embodiment is fabricated.

Figure 6:
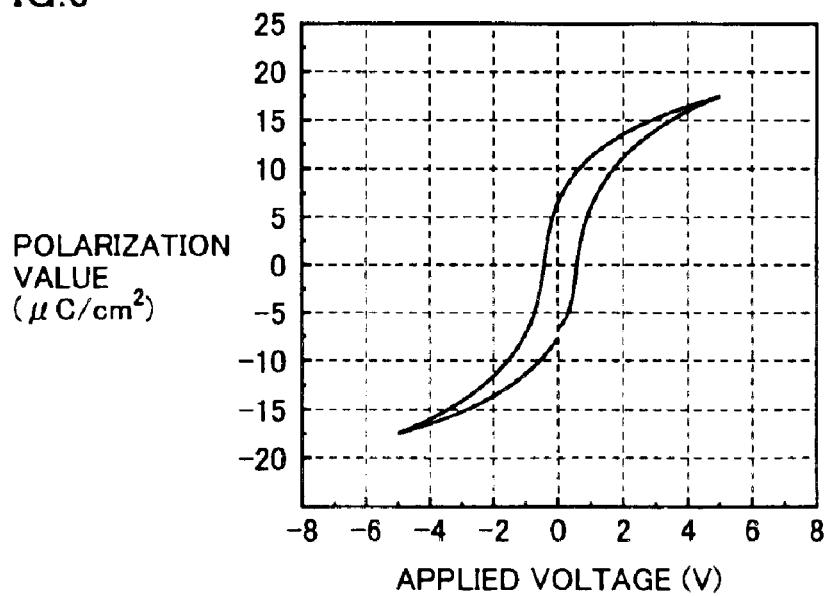
FIGS. 6 and 7 are characteristic diagrams for illustrating effects of the first embodiment of the present invention.

FIG. 6 shows a result of polarization hysteresis of the capacitor structure according to the first embodiment fabricated in the aforementioned manner. Referring to FIG. 6, the vertical axis shows polarization values of a ferroelectric substance and the horizontal axis shows voltage applied to the capacitor. As shown in FIG. 6, the hysteresis of the ferroelectric capacitor according to the first embodiment exhibits an excellent saturation characteristic, reaching about 16.0 $\mu C/cm^2$ at a 2×Pr value (Pr: residual polarization value).

It has been confirmed that the tungsten plugs 13 are oxidized to result in film separation of the lower electrodes in the ferroelectric capacitor or breakage of the ferroelectric capacitor when the capacitor structure according to the first embodiment shown in FIG. 1 is provided with no IrSiN films 14 or no SiN films 17. This indicates that diffusion of oxygen must be prevented in the lower electrodes and regions of the insulator films other than the lower electrodes.

Figure 7:
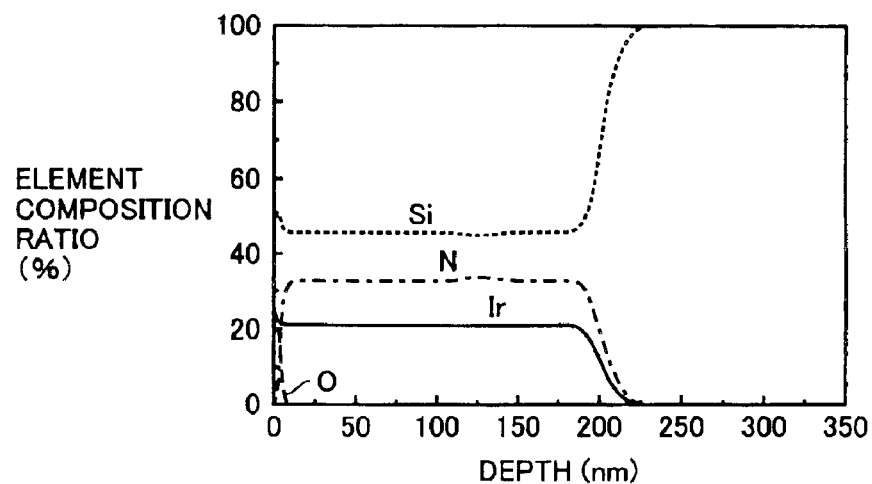

FIG. 7 shows results of element composition ratios measured in a sample structure prepared for verifying oxygen diffusion preventability of an IrSiN film. The sample structure was prepared by depositing IrSiN (200 nm)/polysilicon (600 nm) on an Si substrate. The prepared sample was annealed in an oxygen atmosphere at 800° C. for 40 minutes, and thereafter the element composition ratios along the depth of the sample structure were investigated by RBS (Rutherford backscattering spectrometry). As shown in FIG. 7, diffusion of oxygen in the IrSiN film is not more than 10 nm. Thus, it is understood that the IrSiN films 14 sufficiently prevent diffusion of oxygen.

According to the first embodiment, as hereinabove described, the IrSiN films 14 defining the oxygen diffusion barrier films are arranged on the lower electrodes of the capacitor and the SiN films 17 defining the oxygen diffusion barrier films are arranged on regions other than the lower electrodes to be in contact with the IrSiN films 14, so that the IrSiN films 14 and the SiN films 17 can continuously define the oxygen diffusion barrier films. Therefore, oxygen can be inhibited from diffusing into regions located under the lower electrodes, whereby the tungsten plugs 13 located under the lower electrodes can be effectively inhibited from oxidation.

Thus, film separation can be suppressed and the capacitor element can be prevented from breakage. Consequently, a capacitor element having excellent characteristics can be formed.

According to the first embodiment, further, diffusion of oxygen can be effectively suppressed on the interfaces between the side walls of the lower electrodes and the SiN films 17 by forming the SiN films 17 to cover the side walls of the lower electrodes. Thus, the oxygen diffusion preventability can be further improved.

According to the first embodiment, in addition, the SiO$_2$ films 18 having smaller residual stress than the SiN films 17 are so formed on the SiN films 17 that residual stress of the overall insulator films consisting of the SiN films 17 and the SiO$_2$ films 18 can be reduced. Thus, the insulator films can be effectively prevented from cracking resulting from stress, whereby the fabrication process can be stabilized and the reliability of the element can be improved.

The IrSiN films 14 and the SiN films 17 inhibit oxygen from diffusing into the regions under the lower electrodes so that the tungsten plugs 13 can be prevented from oxidation, whereby a stacked capacitor structure can be formed while suppressing oxidation.

According to the first embodiment, further, the SiN films 17 (dielectric constant: 7.0) and the SiO$_2$ films 18 (dielectric constant: 3.9) having low dielectric constants are embedded between the lower electrodes, so that the parasitic capacitance between the lower electrodes can be reduced as compared with a conventional structure having ferroelectric films (dielectric constant: about 200 to 300 in SBT, for example) arranged between lower electrodes.

In the fabrication process according to the first embodiment, the insulator films consisting of the SiN films 17 and the SiO$_2$ films 18 defining the oxygen diffusion barrier films can be readily embedded between the lower electrodes consisting of the IrSiN films 14 defining the oxygen diffusion barrier films and the Pt films 15 by CMP. Thus, the capacitor element structure capable of suppressing oxidation of the tungsten plugs 13 located under the lower electrodes can be readily fabricated.

(Second Embodiment)

Figure 8:
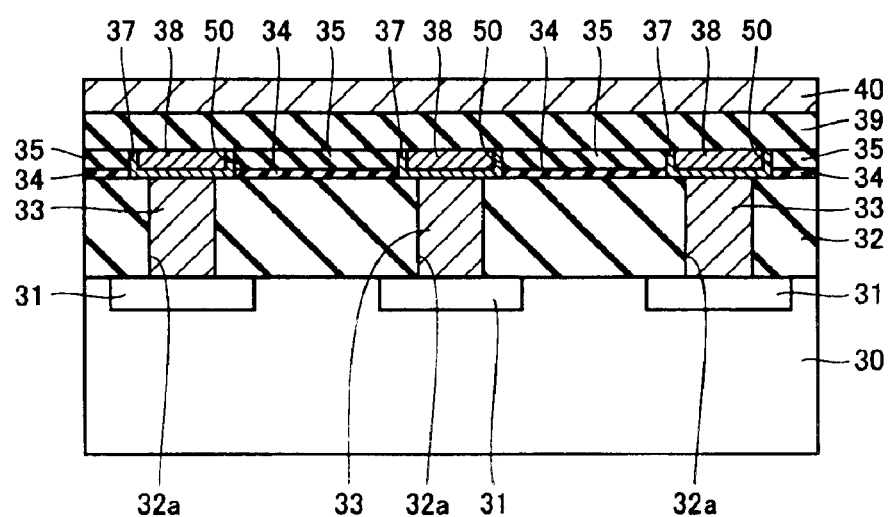
FIG. 8 is a sectional view showing the structure of a capacitor element according to a second embodiment of the present invention.

In a capacitor element according to a second embodiment of the present invention, openings 50 are provided in an SiN film 34 defining an oxygen diffusion barrier film and an SiO$_2$ film 35 so that capacitor lower electrodes including IrSiN films 37 defining oxygen diffusion barrier films are embedded in the openings 50 as shown in FIG. 8, dissimilarly to the aforementioned first embodiment. This structure is now described in detail.

In the capacitor structure according to the second embodiment, n-type doped layers 31 are formed on the surface of an Si substrate 30 at prescribed intervals. An insulator film 32 is formed on the Si substrate 30, and contact holes 32a are formed in the insulator film 32. Tungsten plugs 33 are embedded in the contact holes 32a. The SiN film 34 and the SiO$_2$ film 35 having the openings 50 in regions located on the tungsten plugs 33 are formed on the insulator film 32. The SiN film 34 defines the oxygen diffusion barrier film. In the openings 50, the IrSiN films 37 defining the oxygen diffusion barrier films are formed in a thickness of about 150 nm to be connected to the tungsten plugs 33 and in contact with the side walls of the openings 50. Pt films 38 defining the lower electrodes are formed on the IrSiN films 37. An SBT film 39 which is a ferroelectric film is formed on the SiO$_2$ film 35, the IrSiN films 37 and the Pt films 38. A Pt film 40 defining upper electrodes is formed on the SBT film 39.

The tungsten plugs 33 are examples of the "conductive material" according to the present invention, and the IrSiN films 37 are examples of the "first conductor film" according to the present invention. The Pt films 38 are examples of the "second conductor film" according to the present invention. The SiN film 34 is an example of the "first insulator film" according to the present invention, and the $SiO_2$ film 35 is an example of the "second insulator film" according to the present invention. The SBT film 39 is an example of the "first dielectric film including an oxide-based dielectric film" according to the present invention.

A fabrication process for the capacitor element according to the second embodiment is now described with reference to FIGS. 9 to 12.

Figure 9:
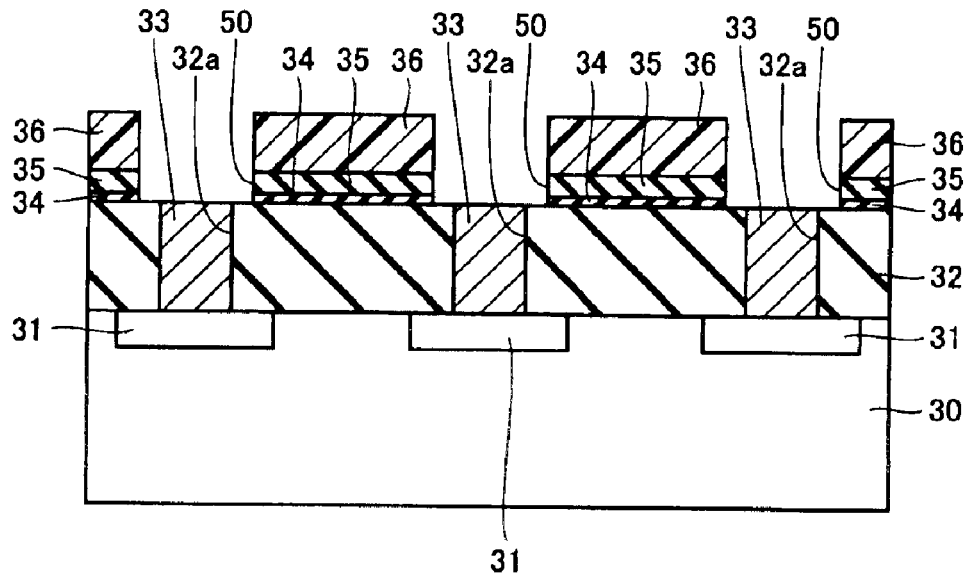
FIGS. 9 to 12 are sectional views for illustrating a fabrication process for the capacitor element according to the second embodiment.
Figure 10:
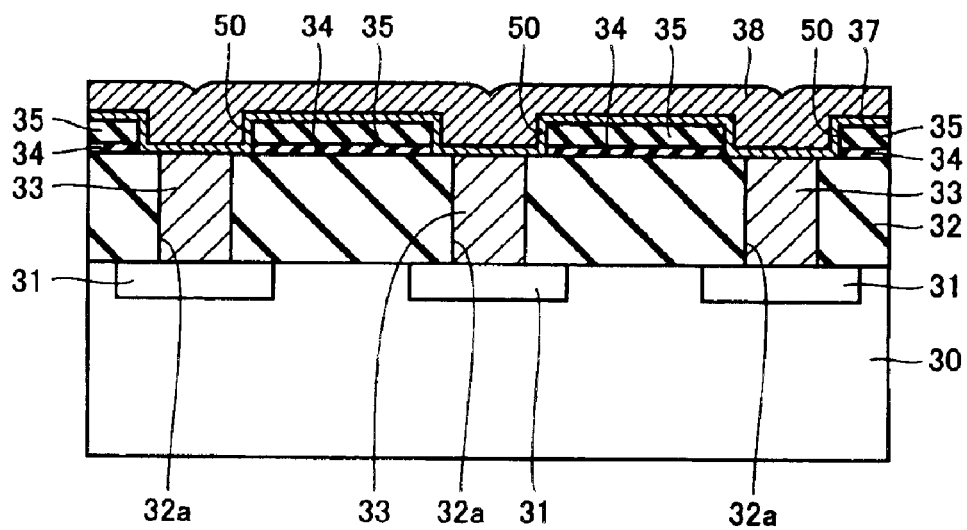

As shown in FIG. 9, the insulator film 32 is formed on the Si substrate 30 formed with the n-type doped layers 31 on its surface. The contact holes 32a are formed in regions of the insulator film 32 located on the n-type doped layers 31. The tungsten plugs 33 are embedded in the contact holes 32a. The SiN film 34 serving as the oxygen diffusion barrier film is deposited on the insulator film 32 and the tungsten plugs 33 in a thickness of about 50 nm. Then, the $SiO_2$ film 35 is deposited in a thickness of about 250 nm. Photoresist films 36 are formed on prescribed regions of the $SiO_2$ film 35, and employed as masks for etching the $SiO_2$ film 35 and the SiN film 34, thereby forming the openings 50. Thereafter the photoresist films 36 are removed.

Thereafter the IrSiN films 37 defining the oxygen diffusion barrier films are formed in the openings 50 and on the $SiO_2$ film 35 in a thickness of about 150 nm. Then, the Pt films 38 defining the lower electrodes are formed in a thickness of about 200 nm, thereby obtaining the structure shown in FIG. 10.

Figure 11:
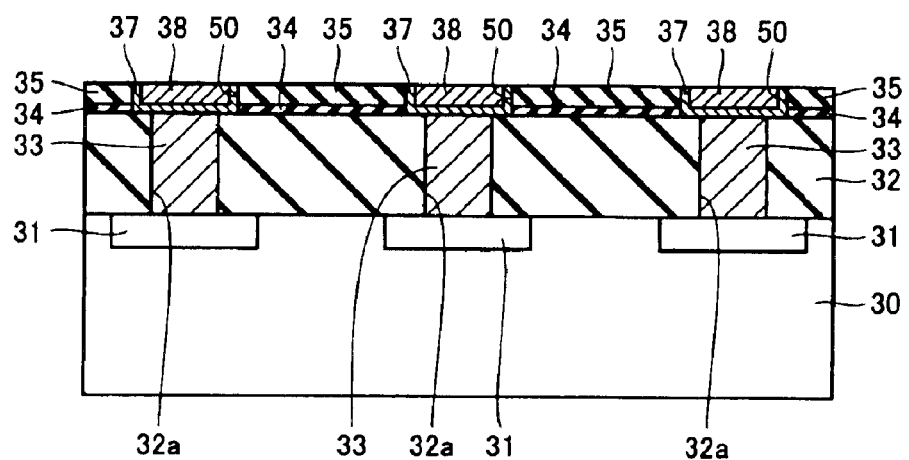

Thereafter the Pt films 38 and the IrSiN films 37 located on the $SiO_2$ film 35 are removed, thereby obtaining the structure shown in FIG. 11. Through the aforementioned steps, the lower electrodes consisting of the IrSiN films 37 and the Pt films 38 are embedded in the openings 50 of an insulator film consisting of the SiN film 34 and the $SiO_2$ film 35. Also in this structure, the IrSiN films 37 defining the oxygen diffusion barrier films arranged on the lower electrodes and the SiN film 34 defining the oxygen diffusion barrier film arranged on regions other than the lower electrodes are in contact with each other. Thus, the IrSiN films 37 and the SiN film 34 inhibit oxygen from downward diffusion.

Figure 12:
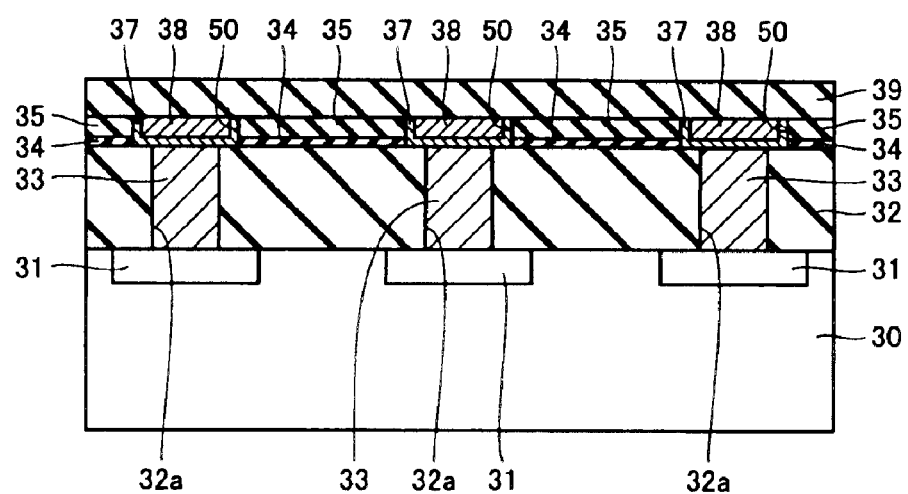
Figure 13:
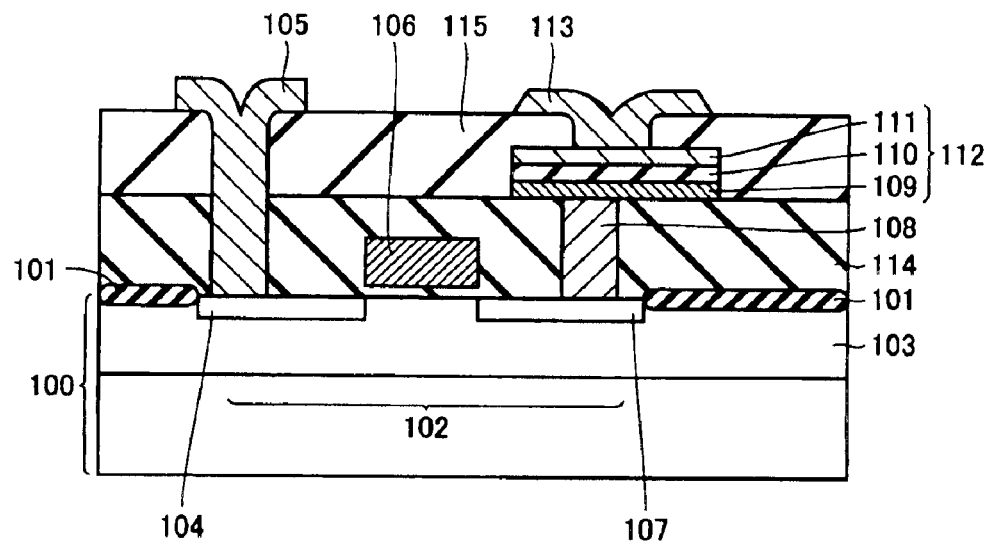
FIG. 13 is a sectional view showing the structure of a conventional ferroelectric memory.
Figure 14:
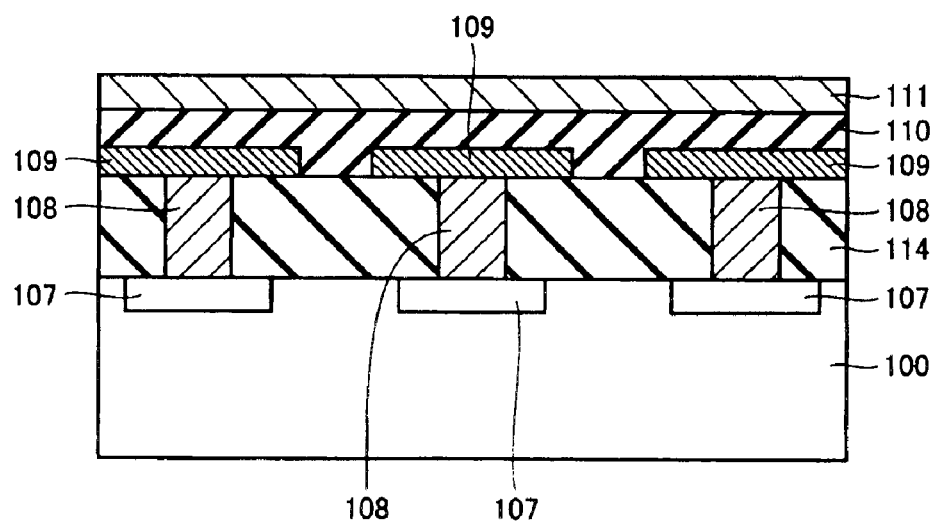
FIG. 14 is a sectional view showing a conventional capacitor part shown in FIG. 13 as viewed from a direction rotated by 90°.

Thereafter the SBT film 39 is formed to cover the overall surface by a sol-gel method in a thickness of about 200 nm, as shown in FIG. 12. In this case, pre-annealing is performed at 200° C. for five minutes. Application is performed twice.

Finally, the Pt film 40 defining the upper electrodes is formed on the SBT film 39, as shown in FIG. 8. A photoresist film (not shown) is formed on a prescribed region of the Pt film 40 for patterning the Pt film 40 and the SBT film 39 through the photoresist film. Then, the photoresist film is removed. Thereafter annealing is performed in an oxygen atmosphere at 800° C. for 40 minutes, in order to sinter the SBT film 39.

The capacitor element according to the second embodiment is fabricated in the aforementioned manner. The polarization hysteresis of a sample of a ferroelectric capacitor according to the second embodiment exhibited an excellent saturation characteristic reaching 16.2 $\mu C/cm^2$ at a 2×Pr value.

According to the second embodiment, as hereinabove described, the IrSiN films 37 defining the oxygen diffusion barrier films embedded in the openings 50 and the SiN film 34 defining the oxygen diffusion barrier film arranged on regions other than the capacitors to be in contact with the IrSiN films 37 can inhibit oxygen from diffusing under the lower electrodes in annealing for sintering the SBT film 39. Thus, the tungsten plugs 33 located under the lower electrodes can be inhibited from oxidation similarly to the first embodiment, so that film separation can be suppressed and breakage of the capacitor element can be prevented. Thus, an element having excellent characteristics can be fabricated.

Also in the second embodiment, the SiN film 34 and the $SiO_2$ film 35 having low dielectric constants are embedded between adjacent lower electrodes similarly to the first embodiment, whereby the parasitic capacitance between the lower electrodes can be reduced.

Further, stress of the overall insulator film consisting of the SiN film 34 and the $SiO_2$ film 35 can be reduced by forming the $SiO_2$ film 35 having smaller residual stress on the SiN film 34, whereby the insulator film can be prevented from cracking resulting from stress.

In the aforementioned fabrication process according to the second embodiment, the lower electrodes consisting of the IrSiN films 37 defining the oxygen diffusion barrier films and the Pt films 38 can be readily embedded in the openings 50 of the insulator film consisting of the SiN film 34 and the $SiO_2$ film 35 by CMP. Thus, the capacitor element structure capable of suppressing oxidation of the tungsten plugs 33 located under the lower electrodes can be readily fabricated.

Although the present invention has been described and illustrated in detail, it is clearly understood that the same is by way of illustration and example only and is not to be taken by way of limitation, the spirit and scope of the present invention being limited only by the terms of the appended claims.

For example, while the IrSiN films 14 and 37 are employed as conductor films defining oxygen diffusion barrier films arranged on the lower electrodes in the aforementioned first and second embodiments, the present invention is not restricted to this but PtSiN films, RuSiN films, ReSiN films, NiSiN films, TaSiN films, CoSiN films or MoSiN films may alternatively be employed as conductor films preventing diffusion of oxygen, and such conductor films may be combined with each other.

While the SBT films 19 are 39 which are ferroelectric films are employed as the oxide-based dielectric films in the aforementioned first and second embodiments, the present invention is not restricted to this but still another oxide-based dielectric film such as a PZT film, for example, may be employed.

While the first and second embodiments have been described with reference to ferroelectric capacitor elements, the present invention is not restricted to this but may be applied to a capacitor element employing an oxide-based paraelectric material having a high dielectric constant. In other words, a BST film of an oxide-based paraelectric material or the like may be employed in place of the SBT film 19 or 39 of a ferroelectric material.

While the multilayer structures of the SiN films 17 and 34 defining the oxygen diffusion barrier films and the $SiO_2$ films 18 and 34 are employed as the insulator films arranged on the regions other than the lower electrodes in the aforementioned first and second embodiments, the present invention is not restricted to this but single-layer films of SiN may be employed for defining oxygen diffusion barrier films. However, the SiN films generally have larger residual stress than $SiO_2$ films. When the thickness of the SiN films is increased, therefore, film breakage such as cracking may be caused in film deposition or a subsequent annealing step. As shown in the first and second embodiments, therefore, insulator film structures obtained by combining films serving as oxygen diffusion barrier films and low-stress films are more preferable.

While the SiN films 17 and 34 are employed as insulator films defining oxygen diffusion barrier films in the aforementioned first and second embodiments, the present invention is not restricted to this but SiON films, $Al_2O_3$ films or $TiO_2$ films may alternatively be employed as the insulator films defining oxygen diffusion barrier films, and these insulator films may be combined with each other.

While the $SiO_2$ films 18 and 35 are formed as the low stress films formed on the SiN films 17 and 34 defining the oxygen diffusion barrier films in the aforementioned first and second embodiments, the present invention is not restricted to this but SiOF films or SiOC films may alternatively be employed in place of the $SiO_2$ films, or these insulator films may be combined with each other.

While the tungsten plugs 13 and 33 are employed as plugs in the aforementioned first and second embodiments, the present invention is not restricted to this but polysilicon plugs may alternatively be employed. Also in this case, the polysilicon plugs can be effectively inhibited from oxidation.

The present invention is not restricted to a capacitor element but is applicable to a general element employing a dielectric material.

What is claimed is:

1. A dielectric element comprising:
a lower electrode including a first conductor film having a function of suppressing diffusion of oxygen;
a first insulator film, formed on said lower electrode, including an oxide-based dielectric film;
a second insulator film, arranged on a region other than said lower electrode, having a function of suppressing diffusion of oxygen; and
a second conductor film including platinum formed on the first conductor film, and the second conductor film constitutes a lower electrode.
wherein said first conductor film contains a metal, silicon and nitrogen, and said metal includes at least one element selected from a group consisting of Ir, Pt, Ru, Re and Ni, and
said second insulator film is arranged to be in contact with said first conductor film.

2. The dielectric element according to claim 1, wherein said second insulator film has a smaller dielectric constant than said oxide-based dielectric film.

3. The dielectric element according to claim 1, wherein said second insulator film is formed to cover the side walls of said lower electrode.

4. The dielectric element according to claim 1, further comprising a third insulator film, formed on said second insulator film, having smaller residual stress than said second insulator film.

5. The dielectric element according to claim 1, wherein said second insulator film includes at least one film selected from a group consisting of an SiN film, an SiON film, an $Al_2O_3$ film and a $TiO_2$ film.

6. The dielectric element according to claim 5, further comprising a third insulator film having at least one film selected from a group consisting of an $SiO_2$ film, an SiOF film and an SiOC film.

7. The dielectric element according to claim 1, wherein said lower electrode including said first conductor film is formed on a conductive material.

8. The dielectric element according to claim 7, wherein said conductive material includes either a tungsten plug or a polysilicon plug.

9. A dielectric element comprising:
a lower electrode including a first conductor film, wherein the first conductor film has a function of suppressing diffusion of oxygen;
a first insulator film, formed on said lower electrode, the first insulator film including an oxide-based dielectric film;
a second insulator film, arranged on a region other than said lower electrode, the second insulator film having a function of suppressing diffusion of oxygen; and
a third insulator film, formed on said second insulator film, having smaller residual stress than said second insulator film,
wherein said first conductor film comprises a metal, silicon and nitrogen, and said metal includes at least one element selected from a group consisting of iridium, platinum, ruthenium, rhenium, and nickel, and
wherein said second insulator film is arranged to be in contact with said first conductor film.

10. A dielectric element comprising:
a lower electrode including a first conductor film, the first conductor film having a function of suppressing diffusion of oxygen;
a first insulator film, formed on said lower electrode, the first insulator film including an oxide-based dielectric film;
a second insulator film, arranged on a region other than said lower electrode, the second insulator film having a function of suppressing diffusion of oxygen,
said second film including at least one component selected from a group consisting of SiN, SiON, $Al_2O_3$ and $TiO_2$, and
a third insulator film formed on said second insulator film,
wherein said first conductor film contains a metal, silicon and nitrogen, and said metal includes at least one element selected from a group consisting of iridium, platinum, ruthenium, rhenium, and nickel, and
wherein said second insulator film is arranged to be in contact with said first conductor film.

11. The dielectric element according to claim 10, wherein said third insulator film includes at least one component selected from a group consisting of $SiO_2$, SiOF and SiOC.

* * * * *